(12) United States Patent
Yow et al.

(10) Patent No.: US 9,071,674 B2
(45) Date of Patent: Jun. 30, 2015

(54) PROTECTIVE COVER FOR PORTABLE ELECTRONIC DEVICE

(75) Inventors: Hong Lip Yow, Chino, CA (US); Yi-Chieh Su, Chino, CA (US)

(73) Assignee: AFC TRIDENT, INC., Ontario, CA (US)

( * ) Notice: Subject to any disclaimer, the term of this patent is extended or adjusted under 35 U.S.C. 154(b) by 624 days.

(21) Appl. No.: 13/163,603

(22) Filed: Jun. 17, 2011

(65) Prior Publication Data

US 2012/0320498 A1 Dec. 20, 2012

(51) Int. Cl.
| | |
|---|---|
| *H05K 5/00* | (2006.01) |
| *H05K 7/00* | (2006.01) |
| *G06F 1/16* | (2006.01) |
| *H04M 1/02* | (2006.01) |
| *H05K 5/02* | (2006.01) |
| *H05K 5/06* | (2006.01) |

(52) U.S. Cl.
CPC ........ *H04M 1/0283* (2013.01); *Y10T 29/49826* (2015.01); *H05K 5/0221* (2013.01); *H05K 5/068* (2013.01); *H05K 5/0226* (2013.01); *H05K 5/069* (2013.01)

(58) Field of Classification Search
CPC . H04B 1/3888; H05K 5/0221; H05K 5/0226; H05K 5/068; H05K 5/069
USPC ............ 361/679.3, 679.56, 679.02; 206/320, 206/701
See application file for complete search history.

(56) References Cited

U.S. PATENT DOCUMENTS

| | | | |
|---|---|---|---|
| 5,388,692 A * | 2/1995 | Withrow et al. | 206/320 |
| 6,785,566 B1 * | 8/2004 | Irizarry | 455/575.8 |
| 7,594,576 B2 * | 9/2009 | Chen et al. | 206/320 |
| 7,663,879 B2 * | 2/2010 | Richardson et al. | 361/679.56 |
| 7,933,122 B2 | 4/2011 | Richardson et al. | |
| D641,013 S * | 7/2011 | Richardson et al. | D14/250 |
| 8,395,894 B2 * | 3/2013 | Richardson et al. | 361/679.55 |
| 2007/0184781 A1 * | 8/2007 | Huskinson | 455/42 |
| 2009/0080153 A1 * | 3/2009 | Richardson et al. | 361/679.56 |
| 2010/0200456 A1 * | 8/2010 | Parkinson | 206/701 |
| 2010/0203931 A1 * | 8/2010 | Hynecek et al. | 455/575.8 |
| 2012/0074005 A1 * | 3/2012 | Johnson et al. | 206/320 |
| 2012/0305422 A1 * | 12/2012 | Vandiver | 206/320 |

* cited by examiner

*Primary Examiner* — Anthony Haughton
(74) *Attorney, Agent, or Firm* — Konrad Raynes Davda & Victor LLP; David W. Victor

(57) ABSTRACT

A protective cover assembly for a portable electronic device that includes a cushion enclosure that has a main body portion and a pouch pivotably connected to the main body portion, and front and back shells that cooperate to form a hard shell housing that at least partially encloses the main body portion of the cushion enclosure. The pouch extends outside the hard shell housing and is pivotable between a docking position and a non-docking position.

20 Claims, 4 Drawing Sheets

PROTECTIVE COVER FOR PORTABLE ELECTRONIC DEVICE

FIELD OF THE INVENTION

This invention is directed to a protective cover for a portable electronic device and more particularly to a protective cover for a portable electronic device that enables docking of the device.

BACKGROUND OF THE INVENTION

Over the past decade or so, mobile phones have become ubiquitous and are almost a necessity. Therefore, the protection of mobile phones from damage has become important. In particular, many people drop and break there phones, which causes them to have to spend money to buy a new phone. Accordingly, covers and the like for protecting mobile phones have become popular. For example, see U.S. Pat. No. 7,933,122, issued on Apr. 26, 2011, the entirety of which is incorporated herein by reference.

SUMMARY OF THE PREFERRED EMBODIMENTS

In accordance with one aspect of the present invention, there is provided a protective cover assembly for a portable electronic device that includes a cushion enclosure that has a main body portion and a pouch pivotably connected to the main body portion, and front and back shells that cooperate to form a hard shell housing that at least partially encloses the main body portion of the cushion enclosure. The pouch extends outside the hard shell housing and is pivotable between a docking position and a non-docking position. In a preferred embodiment, the pouch is pivotably connected to the main body portion by a hinge portion, the bottom flange of the back shell includes tabs that cooperate to define a gap and a slot therebetween, and the hinge portion is received in the slot. In another preferred embodiment, the back surface of the cushion enclosure has a raised portion extending therefrom, the back shell has an opening defined therein through which the raised portion extends, and the raised portion has a height dimension that is larger than the thickness dimension of the back shell.

In accordance with another aspect of the present invention, there is provided a method that includes the steps of providing a cushion enclosure that includes a front, a back, an interior, a main body portion and a pouch pivotably connected to the main body portion, positioning a portable electronic device having a bottom portion in the interior of the cushion enclosure, positioning a front shell over at least a portion of the front of the cushion enclosure, positioning a back shell over at least a portion of the back of the cushion enclosure, and securing the front shell to the back shell to form a hard shell housing. The pouch extends outside of the hard shell housing and receives at least a portion of the bottom portion of the portable electronic device.

In accordance with another aspect of the present invention, there is provided a protective cover assembly for a portable electronic device that includes a cushion enclosure that defines an interior for receiving the portable electronic device and includes at least a back surface that has a raised portion extending therefrom, and front and back shells that cooperate to form a hard shell housing that at least partially encloses the cushion enclosure. The back shell has an opening defined therein through which the raised portion extends, and the raised portion has a height dimension that is larger than the thickness dimension of the back shell.

Other features and advantages of the present invention will become apparent to those skilled in the art from the following detailed description. It is to be understood, however, that the detailed description of the various embodiments and specific examples, while indicating preferred and other embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The invention may be more readily understood by referring to the accompanying drawings in which.

Like numerals refer to like parts throughout the several views of the drawings.

DETAILED DESCRIPTION

Figure 1:
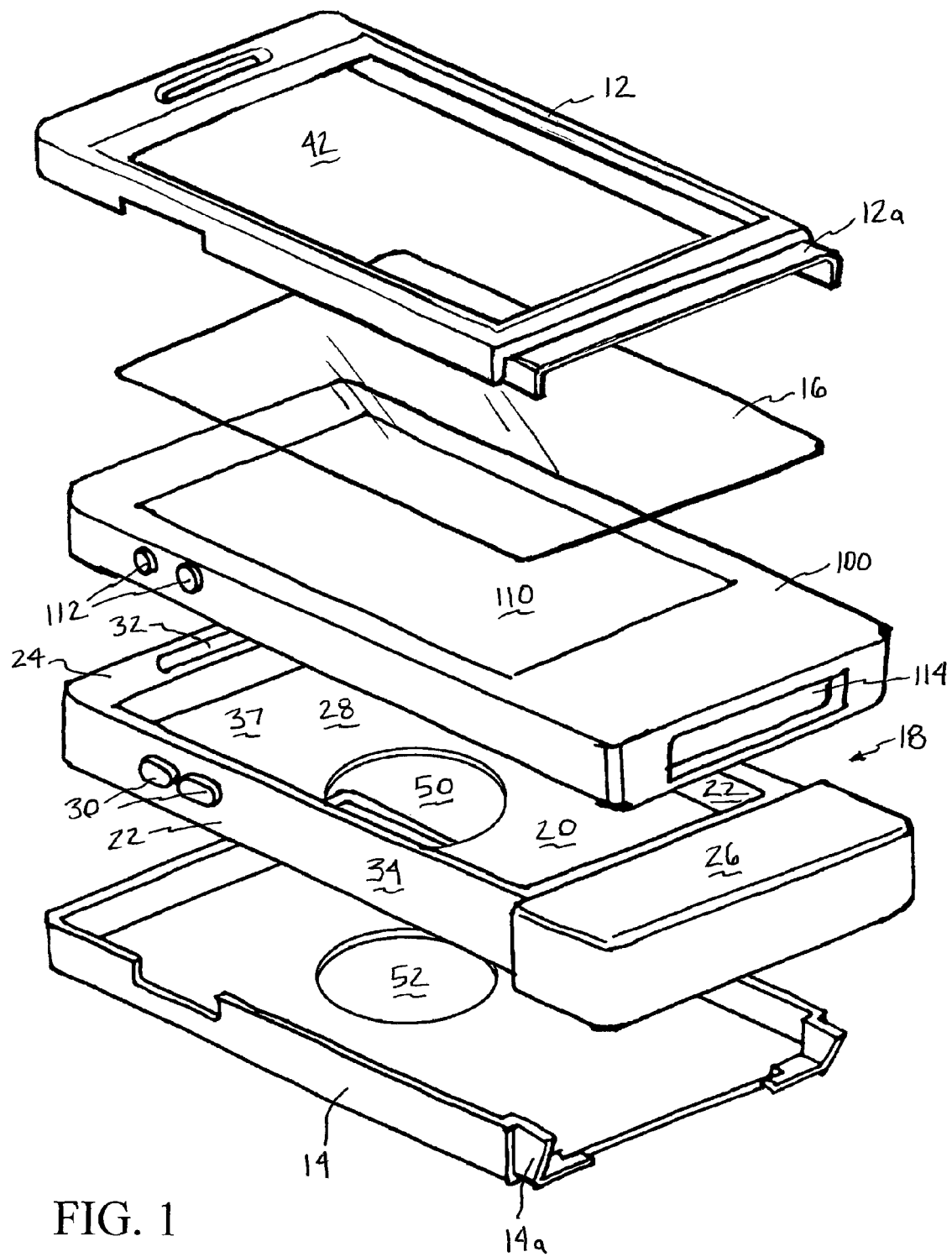
FIG. 1 is an exploded view of a protective cover assembly for a portable electronic device in accordance with an embodiment of the present invention.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are references to the same embodiment; and, such references mean at least one of the embodiments.

Reference in this specification to "one embodiment" or "an embodiment" means that a particular feature, structure, or characteristic described in connection with the embodiment is included in at least one embodiment of the-disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks:

The use of highlighting has no influence on the scope and meaning of a term; the scope and meaning of a term is the same, in the same context, whether or not it is highlighted. It will be appreciated that the same thing can be said in more than one way.

Consequently, alternative language and synonyms may be used for any one or more of the terms discussed herein. Nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

It will be appreciated that terms such as "front," "back," "top," "bottom," "left," "right," "above," and "side" used herein are merely for ease of description and refer to the orientation of the components as shown in the figures. It should be understood that any orientation of the components described herein is within the scope of the present invention.

As shown in FIGS. 1-5, the present invention is preferably directed to a protective cover assembly 10 for a hand-held electronic device or the like. In the figures, the hand-held electronic device is a mobile phone 100. However, this is not a limitation on the present invention and the protective cover assembly 10 can be used with any type of portable electronic device, including personal digital assistants (PDAs), computers, tablets, notebooks, smartphones, mobile phones, satellite phones, cellular phones, pagers, music players, MP3 players, media players, digital cameras, video cameras, global positioning system devices (GPS), portable game consoles and the like.

Figure 2:
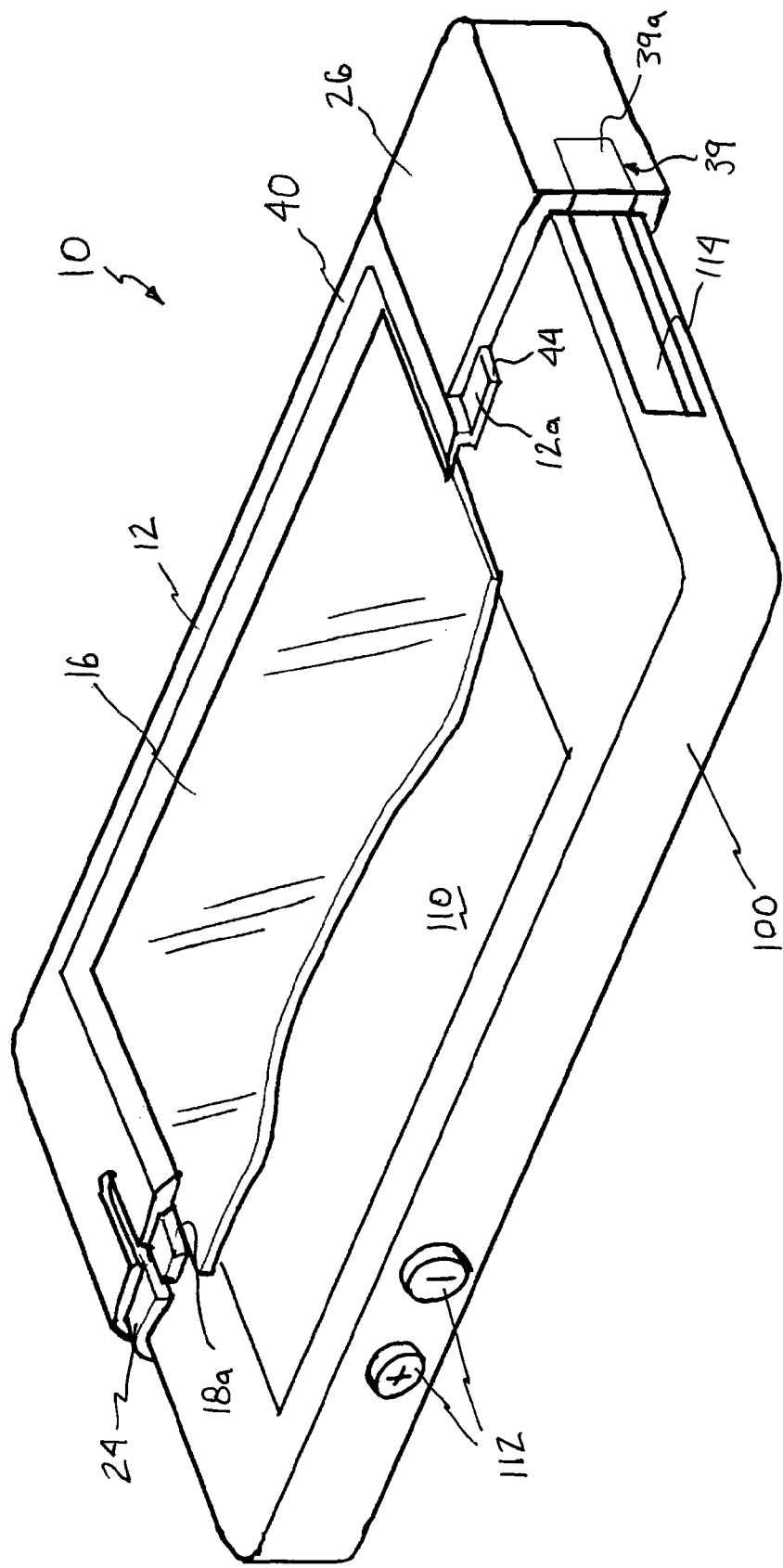
FIG. 2 is a front perspective view of the protective cover assembly of FIG. 1 on a mobile phone with a portion of the assembly cut away.

In a preferred embodiment, as shown in FIG. 1, the assembly 10 generally includes a front shell 12, a back shell 14, a front cover portion 16 and an inner cushion enclosure 18. Generally, the phone 100 is enclosed within the cushion enclosure 18, the front cover portion 16 is placed over the screen opening 18a in the cushion enclosure and over the phone screen 110 (and the keyboard, if present) and the front and back shells 12 and 14 are secured over the cushion enclosure 18 to form the protective cover assembly 10, as is shown in FIG. 2. In a preferred embodiment, the front cover portion 16 is secured to the inner surface of the front shell 12 such that it covers a screen opening 42 defined in the front shell 12. However, this is not a limitation on the present invention. When fully assembled, the protective cover assembly at least partially and substantially surrounds and provides protection for phone 100.

The front cover portion 16 can be made from a soft, plastic layer such as a soft, thin Lexan (polycarbonate), PVC, urethane, or silicon material that can be molded, such as by thermoforming, casting, stretching, heating, or injection molding, or otherwise shaped to fit to screen 110 of the phone 100 and/or other surfaces of the phone 100. The front cover portion 16 may be made from a single material or multiple materials that are welded, glued or formed together into a single sheet or membrane. For example, for the portion of the front cover portion 16 that is disposed over the display screen 110, it may be desirable to use a clear, thin, hard layer of glass or plastic to provide a clear, transparent material over the display screen that protects the display screen from scratches. The other part of the front cover portion 16 may be made of a thin layer of Lexan (polycarbonate), PVC or a silicon material that is flexible so that a keyboard and other buttons may be pressed through the screen protective portion 16. In another embodiment, the front cover portion 16 may be omitted to allow access to the screen 110 and/or keyboard.

In another embodiment for a phone with a keyboard, the front cover portion 16 may be made so that it is open to allow direct access to the keyboard, while the screen 110 is covered. In addition, various portions of the front cover portion 16 can be made clear, translucent, opaque or any desired color, or any combination of these alternatives. The front cover portion 16 is shown as covering a front portion of the phone 100, but can also be made to wrap around a portion of, or all of, the backside of the phone 100 and be at least partially sealed together, especially if a self-adhering material is used for the front cover portion 16. For example, if a camera is included on the backside of the phone 100, a clear portion of the front cover portion 16 can be used to cover a camera lens (not shown). The front cover portion 16 can also have some elasticity so that it fits tightly to the phone 100. The front cover portion 16 can be thermoformed or otherwise molded to fit the specific shape of all, or a portion of, the surfaces of the phone 100, to provide a tight, form fit to the phone 100. The molding or thermoforming process can be quickly and easily performed by simply generating a mold of the surfaces of the phone 100 to be covered and using that mold to generate a thermoforming mold or other mold. In this manner, a precisely formed membrane that fits tightly to the surfaces of the phone 100 can be simply and easily formed. Overlapping flaps (not shown) can also help to seal the membrane to the electronic device.

Preferably, the cushion enclosure 18 is made of a relatively flexible material such as a thermoplastic, rubber, silicon, urethane, or other material that is capable of stretching sufficiently to allow the phone 100 fit inside of the cushion enclosure 18. The cushion enclosure 18 generally includes a back wall 20, two side walls 22, a top pouch 24 and a bottom pouch 26 that all cooperate to define an interior 28 that receives the phone 100 and provides cushioning in a drop situation and fits snugly over the phone 100.

It will be understood that the protective cover assembly 10 can be modified for different phone models and other portable electronic device models. Accordingly, the cushion enclosure 18 may include pads that are a part of or are connected to the cushion enclosure 18 to allow actuation of switches, buttons or the like that are on the phone 100. The pads can then be depressed by a user to activate a tilt switch or push button switch, such as pads 30 that are positioned to allow a user to operate switches 112 on the phone 100. In another embodiment, the pads can be omitted and an opening can allow access to buttons or switches on the phone. Other pads or openings (such as speaker opening 32) can also be incorporated in the stretchable cushion layer that allow a user to interface with various controls on the phone 100.

As shown best in FIG. 1, the cushion enclosure 18 includes a main body portion 34 (that comprises the back wall 20, two side walls 22 and top pouch 24) and bottom pouch 26, which is pivotable and allows the bottom portion of the phone 100 to be exposed so that the phone 100 can be docked via docking port 114 on a music player, alarm clock, charger or the like (all such devices are referred to herein as a docking station). The cushion enclosure 18 defines a bottom opening 36 into which the phone 100 is slid. The pouch 26 is pivotably connected to the main body portion 34 by a hinge/hinge portion 38 or the like. The hinge 38 can be a thinner portion (either in width or thickness) of the cushion enclosure 18 or can be another type of hinge or the like that allows the pouch to pivot. When the phone 100 is initially placed in the interior 28 of the cushion enclosure 18, the pouch 26 is hinged out of the way, phone 100 is slid into bottom opening 36 or front opening 37 and then the pouch 26 is hinged back into place such that it covers the bottom of the phone 100.

The pouch 26 is pivotable or movable between a docking position (see FIG. 3) and a non-docking position (see FIG. 2). When a user wants to dock the phone 100 onto a digital music player or the like, the pouch 26 is hinged or pivoted out of the way (to the docking position) so that the bottom of the phone 100 is exposed and the phone 100 is docked. Preferably, the pouch 26 is made of a soft, flexible material, such as rubber or silicon. However, it can also be made of a hard material, such as plastic. In a preferred embodiment, the pouch 26 includes a charger opening 39 (which may be covered by a pivotable cover 39a) in the bottom thereof that allows a charger to be inserted into the charging/docking port 114 of phone 100.

Preferably, the front and back shells 12 and 14 are made of a relatively hard material, such as an ABS material, propylene, a polycarbonate, thermoplastics, metals, composite materials, and other rigid materials used in injection molding and the like. It will be understood that assembly 10 can be used and designed differently for different types of phones or similar devices. Accordingly, front and back shells 12 and 14 can include different openings, slots, etc. for access to buttons, switches, cameras and the like on different phones.

As shown in FIGS. 1-5, in a preferred embodiment, the front shell 12 fits snuggly over at least a portion of the main body portion 34 of the cushion enclosure 18 and snaps together with the back shell 14. The method of connecting the front and back shells 12 and 14 to one another is not a limitation on the present invention. It may be done via snap fit, tabs, or other known methods. The assembly of the front shell 12 and back shell 14 form an assembled hard shell housing 40. It will be understood that housing 40 is preferably sized and shaped to form a rigid cover for the cushion enclosure 18. As shown in FIG. 2, in a preferred embodiment, the front shell 12 includes screen opening 42 that is sized to secure the front cover portion 16 in place. The front cover portion 16 may be a separate piece, or may be adhered or attached to the front shell 12. In a preferred embodiment, the molded, snug fit of the front cover portion 16 to the phone 100, as well as the tight fit of the cushion enclosure 18, front shell 12 and back shell 14 to the phone 100 and/or to each other, helps to seal the phone 100 within the protective cover assembly 10. Further, the tight fit of the stretchable cushion enclosure 18 also helps to keep water, dirt and dust out.

In a preferred embodiment, the front and back shells 12 and 14 include bottom flanges 12a and 14a that cooperate to form or create a seat 44 onto which the pivotable pouch 26 is received, as is shown in FIG. 2. In other words, in the non-docking position, the seat 44 extends downwardly into the interior of the pouch 26. The bottom flanges 14a of the back shell 14 include tabs 45 that define a gap 46 and a slot 48 therebetween into which the hinge 38 is received (the hinge 38 is secured in place by shoulders 45a on tabs 45). When assembling the assembly 10, the hinge 38 is inserted through the gap 46. As shown in FIG. 2, the hinge 38 is preferably wider than the gap 46. However, because the hinge 38 is made of a flexible material it can be inserted through the gap 46 and into the slot 48. In a preferred embodiment, the bottom flanges 12a and 14a and the interior of the pouch 26 can include corresponding tabs, ridges 49, openings or the like to help keep the pouch 26 in place during normal phone use (the non-docking position). In another embodiment, the hinge 38 can be on the front of enclosure 18 and the gap 46, slot 48 and tabs 45 can be part of the front shell 12. In another embodiment, the gap can be omitted and the hinge portion 38 can extend through a closed slot 48.

Figure 3:
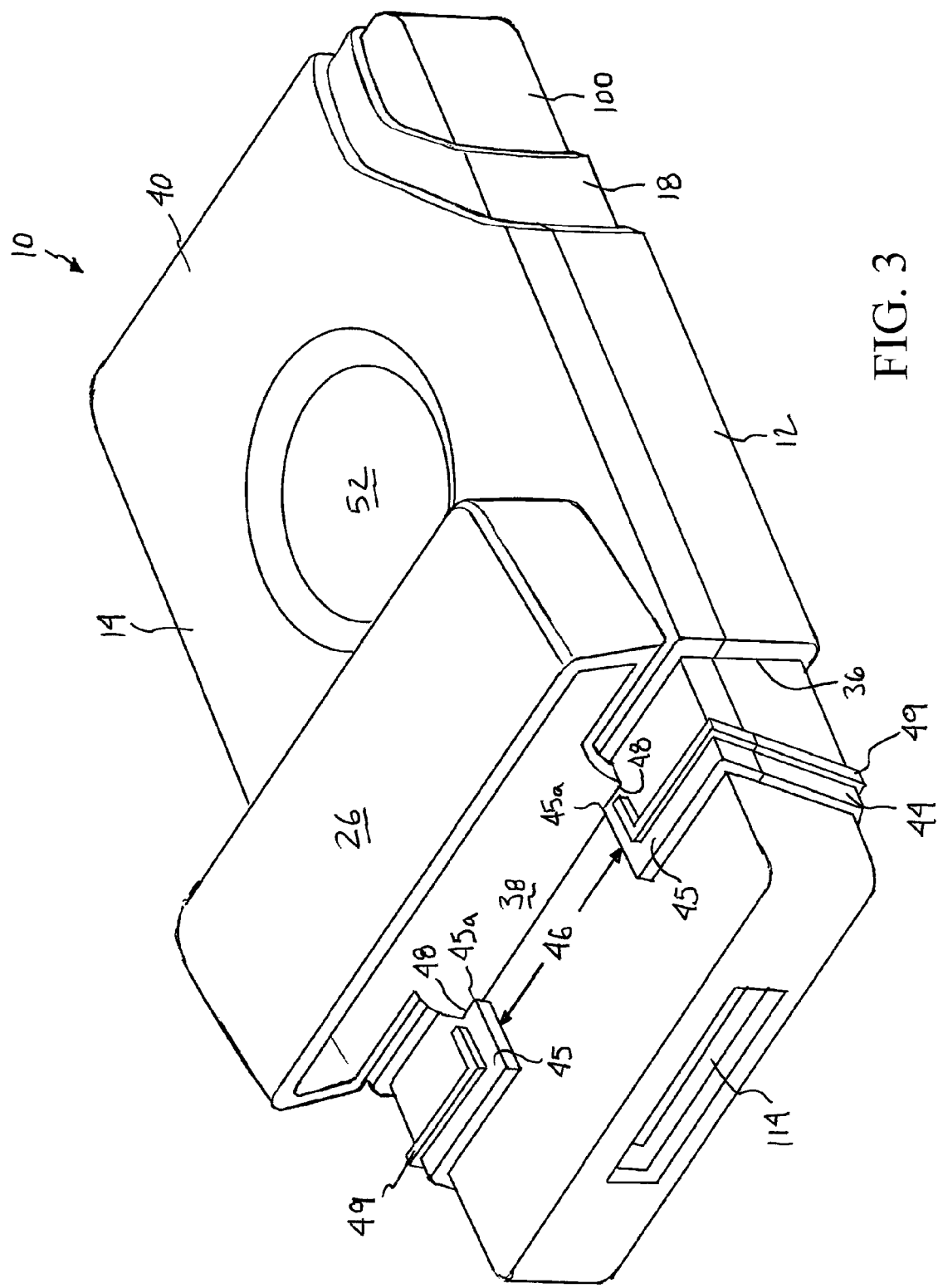
FIG. 3 is a rear perspective view of the protective cover assembly of FIG. 1 on a mobile phone with a portion of the assembly cut away and the pouch pivoted to the docking position.
Figure 4:
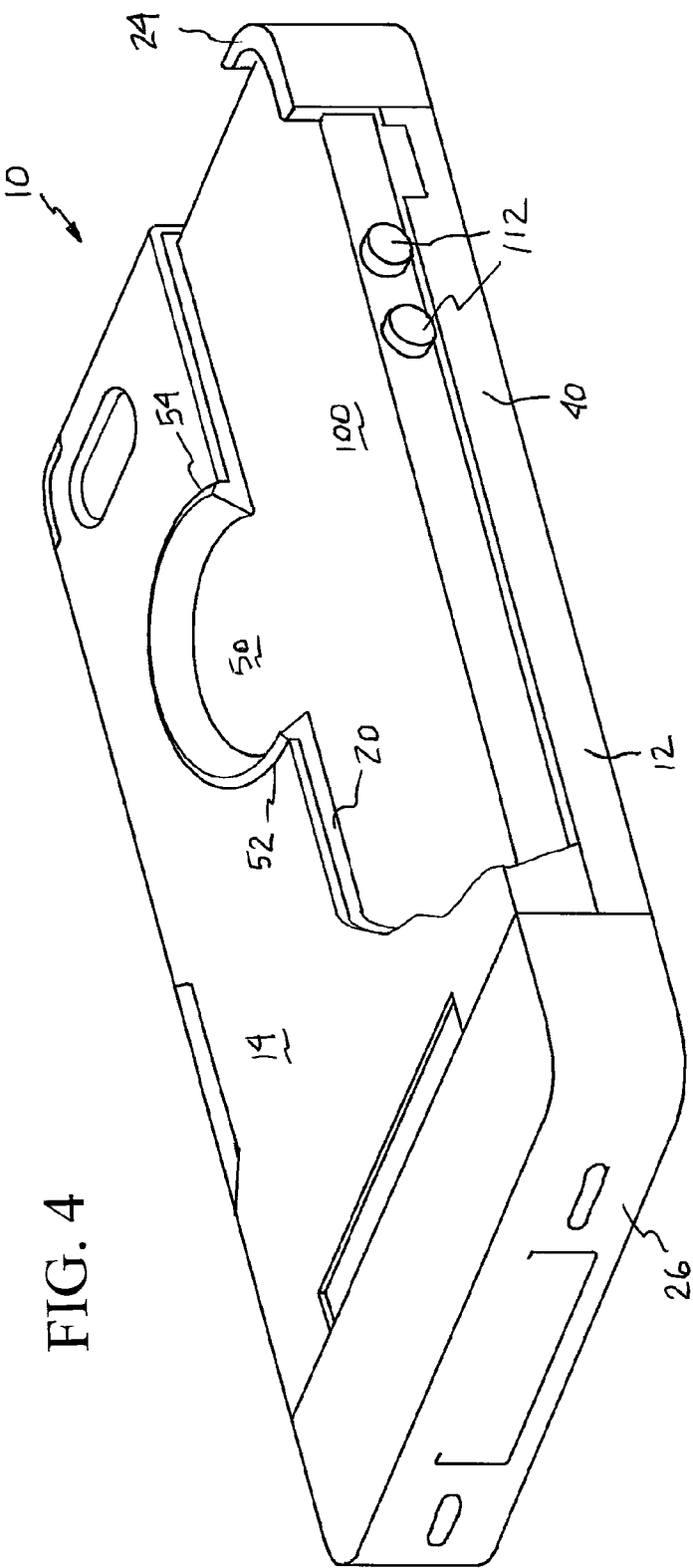
FIG. 4 is a rear perspective view of a protective cover assembly for a portable electronic device that includes an anti-skid raised portion in accordance with another embodiment of the present invention.
Figure 5:
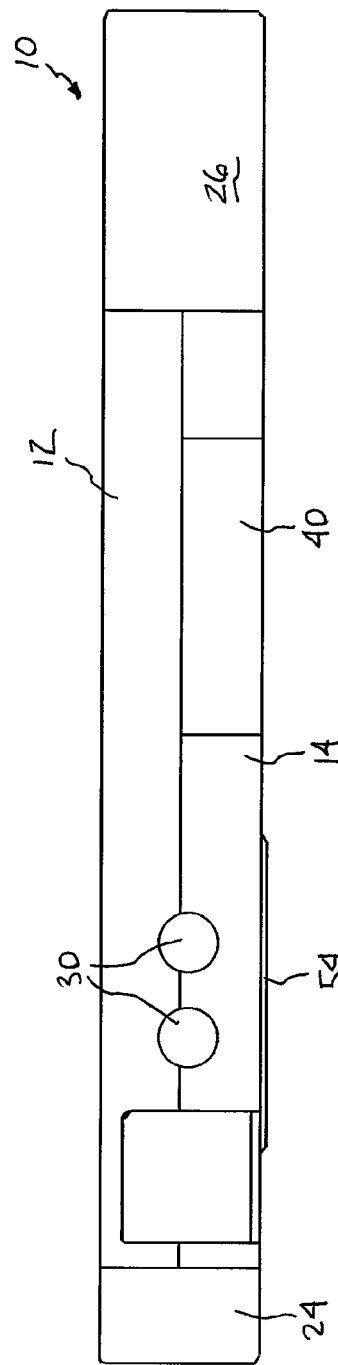
FIG. 5 is a side elevational view of the protective cover assembly of FIG. 4.

As shown in FIGS. 1 and 3, in a preferred embodiment, the back wall 20 of cushion enclosure 18 has an opening 50 that corresponds to an opening 52 in the back shell 14. When an iPhone® is placed in the protective cover assembly 10, the Apple logo is visible through the concentric openings 50 and 52. As shown in FIGS. 4-5, in a preferred embodiment, opening 52 has a larger diameter than opening 50 and back wall 20 includes a circular shaped flange or raised portion 54 that has a height dimension that is larger than the thickness of back shell 14. With this arrangement, flange 54 extends outside of back shell 14. The flange 54 is preferably made of silicon or other rubber and provides an anti-skid function. In other words, when the protective cover assembly 10 and phone 100 are placed on a surface such as a table, the flange 54 contacts the surface and helps prevent the phone and assembly from sliding. It will be understood that openings 50 and 52 and flange 54 can be any shape (not just circular) and do not have to be corresponding shapes. Also, flange 54 does not have to be continuous. In another embodiment, opening 50 can be omitted. In another embodiment, raised portion 54 can be a logo or other design that extends through opening 52.

In another embodiment, the cushion enclosure 18 can be made of a hard material, such as plastic or the like and the front and back shells 12 and 14 can be made of a relatively flexible material, such as silicon or rubber. In an embodiment, the cushion enclosure 18 and the front and back shells 12 and 14 can be made of the same material.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description of the Preferred Embodiments using the singular or plural number may also include the plural or singular number respectively. The word "or" in reference to a list of two or more items, covers all of the following interpretations of the word: any of the items in the list, all of the items in the list, and any combination of the items in the list.

The above-detailed description of embodiments of the disclosure is not intended to be exhaustive or to limit the teachings to the precise form disclosed above. While specific embodiments of and examples for the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed, at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference in their entirety. Aspects of the disclosure can be modified, if necessary, to employ the systems, functions, and concepts of the various references described above to provide yet further embodiments of the disclosure.

These and other changes can be made to the disclosure in light of the above Detailed Description of the Preferred Embodiments. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features or aspects of the disclosure with which that terminology is associated. In general, the terms used in the following claims should not be construed to limit the disclosures to the specific embodiments disclosed in the specification unless the above Detailed Description of the Preferred Embodiments section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. §112, ¶6, other aspects may likewise be embodied as a means-plus-function claim, or in other forms, such as being embodied in a computer-readable medium. (Any claims intended to be treated under 35 U.S.C. §112, ¶6 will begin with the words "means for"). Accordingly, the applicant reserves the right to add additional claims after filing the application to pursue such additional claim forms for other aspects of the disclosure.

Accordingly, although exemplary embodiments of the invention have been shown and described, it is to be understood that all the terms used herein are descriptive rather than limiting, and that many changes, modifications, and substitutions may be made by one having ordinary skill in the art without departing from the spirit and scope of the invention.

What is claimed is:

1. A protective cover assembly for a portable electronic device, the assembly comprising:
   a cushion enclosure that includes a main body portion and a pouch pivotably connected to a hinge on a back surface of the main body portion, and
   front and back shells that cooperate to form a hard shell housing that at least partially encloses the main body portion of the cushion enclosure, wherein the pouch extends outside the hard shell housing and is pivotable between a docking position and a non-docking position, wherein all surfaces of the pouch that enclose corresponding surfaces of the hard shell housing pivot together at the hinge.

2. The protective cover assembly of claim 1 wherein the front and back shells include bottom flanges extending downwardly therefrom that cooperate to form a seat, wherein in the non-docking position, the pouch is received on the seat.

3. The protective cover assembly of claim 2 wherein the bottom flange of the back shell includes tabs that cooperate to define a gap and a slot therebetween, wherein the hinge portion is received in the slot.

4. The protective cover assembly of claim 3 wherein the main body portion has a back wall and the hinge portion connects the back wall and the pouch.

5. The protective cover assembly of claim 4 wherein the hinge portion has a thinner dimension than the back wall.

6. The protective cover assembly of claim 1 wherein the back surface of the cushion enclosure has a raised portion extending therefrom, wherein the back shell has an opening defined therein through which the raised portion extends, wherein the raised portion has a height dimension that is larger than the thickness dimension of the back shell.

7. The protective cover assembly of claim 1 wherein the front shell includes a screen opening defined therein that is at least partially covered by a front screen cover.

8. The protective cover assembly of claim 1 wherein the cushion enclosure is made of a flexible material and the hard shell housing is made of a rigid material.

9. The protective cover assembly of claim 1, wherein the hard shell housing is adapted to partially enclose an exterior surface of the cushion enclosure.

10. The protective cover assembly of claim 1, wherein the pouch extends through an opening at an end of the hard shell housing.

11. The protective cover assembly of claim 1, wherein the pouch is adapted to partially enclose a plurality of surfaces of the portable electronic device.

12. The protective cover assembly of claim 11, wherein the pouch is adapted to partially enclose an end of the portable electronic device having a docking port.

13. The protective cover assembly of claim 1, wherein the pouch includes an opening to expose a charger on the portable electronic device when the pouch encloses the portable electronic device.

14. A method comprising the steps of:
   providing a cushion enclosure that includes a front, a back, an interior, a main body portion and a pouch pivotably connected to a hinge on a back surface of the main body portion,
   positioning a portable electronic device having a bottom portion in the interior of the cushion enclosure,
   positioning a front shell over at least a portion of the front of the cushion enclosure,
   positioning a back shell over at least a portion of the back of the cushion enclosure, and securing the front shell to the back shell to form a hard shell housing, wherein the pouch extends outside of the hard shell housing and receives at least a portion of the bottom portion of the portable electronic device, wherein all surfaces of the pouch that enclose corresponding surfaces of the hard shell housing pivot together at the hinge.

15. The method of claim 14 further comprising the steps of pivoting the pouch to a position where the bottom portion of the portable electronic device is not received in the pouch, and docking the portable electronic device on a docking station.

16. The method of claim 14 wherein the front and back shells include bottom flanges extending downwardly therefrom that cooperate to form a seat, wherein the bottom portion of the portable electronic device and at least a portion of the seat are received in the pouch.

17. The method of claim 14 wherein the bottom flange of the back shell includes tabs that cooperate to define a gap and a slot therebetween, and wherein the method further includes inserting the hinge portion through the gap and positioning the hinge portion in the slot.

18. A protective cover assembly for a portable electronic device, the assembly comprising:
   a cushion enclosure that defines an interior for receiving the portable electronic device and includes at least a back surface, wherein the back surface has a raised portion extending therefrom, and
   front and back shells that cooperate to form a hard shell housing that at least partially encloses the cushion enclosure, wherein the back shell extends across a portion of the back surface of the cushion enclosure, wherein the back shell has an opening defined therein through which the raised portion extends, wherein the raised portion has a height dimension that is larger than the thickness dimension of the back shell, and wherein the raised portion extends through the opening to extend external to the hard shell housing.

19. The protective cover assembly of claim 18 wherein the cushion enclosure and the raised portion are made of a flexible material and the hard shell housing is made of a rigid material.

20. The protective cover assembly of claim 18, wherein the raised portion defines an opening in the cushion enclosure exposing a portion of a back surface of the portable electronic device.

* * * * *